(12) United States Patent
Suzuki et al.

(10) Patent No.: US 8,754,355 B2
(45) Date of Patent: *Jun. 17, 2014

(54) CHARGE MULTIPLYING SOLID STATE IMAGING DEVICE HAVING MULTIPLICATION REGISTER UNITS WITH DIFFERENT NUMBER OF MULTIPLICATION STAGES

(75) Inventors: Hisanori Suzuki, Hamamatsu-shi (JP); Yasuhito Yoneta, Hamamatsu-shi (JP); Shin-ichiro Takagi, Hamamatsu-shi (JP); Kentaro Maeta, Hamamatsu-shi (JP); Masaharu Muramatsu, Hamamatsu-shi (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 193 days.

This patent is subject to a terminal disclaimer.

(21) Appl. No.: 13/144,727

(22) PCT Filed: Jan. 22, 2010

(86) PCT No.: PCT/JP2010/050805
§ 371 (c)(1),
(2), (4) Date: Jul. 15, 2011

(87) PCT Pub. No.: WO2010/087287
PCT Pub. Date: Aug. 5, 2010

(65) Prior Publication Data
US 2011/0272557 A1      Nov. 10, 2011

(30) Foreign Application Priority Data

Jan. 30, 2009   (JP) ................................. 2009-020511

(51) Int. Cl.
*H01L 27/00*   (2006.01)

(52) U.S. Cl.
USPC ..................................... 250/208.1; 250/214 R

(58) Field of Classification Search
USPC ........................... 250/208.1, 214 R, 214 LA; 348/302–311; 257/290–292, 440
See application file for complete search history.

(56) References Cited

U.S. PATENT DOCUMENTS

| | | | |
|---|---|---|---|
| 6,444,968 B1 | 9/2002 | Burt et al. | |
| 7,755,803 B2 * | 7/2010 | Baba | ............................. 358/461 |
| 2006/0163503 A1 | 7/2006 | Urano et al. | |
| 2007/0041017 A1 | 2/2007 | Robbins et al. | |
| 2007/0242145 A1 | 10/2007 | Hazelwood et al. | |
| 2011/0273603 A1 * | 11/2011 | Suzuki et al. | ................. 348/311 |

FOREIGN PATENT DOCUMENTS

| | | |
|---|---|---|
| CN | 101103461 | 1/2008 |
| EP | 0 866 501 | 9/1998 |
| EP | 1 755 167 | 2/2007 |
| JP | 10-304256 | 11/1998 |

(Continued)

*Primary Examiner* — Que T Le
(74) *Attorney, Agent, or Firm* — Drinker Biddle & Reath LLP

(57) ABSTRACT

A solid-state imaging device 1 according to one embodiment of the present invention is a charge multiplying solid-state imaging device, and includes an imaging area 10 that generates a charge according to the amount of incident light, a plurality of output register units 21 to 24 that receive the charge from the imaging area 10, and a plurality of multiplication register units 31 to 34 that multiply charges from the output registers 21 to 24, respectively, and the multiplication register units 31 to 34 are different in the number of multiplication stages from each other.

5 Claims, 9 Drawing Sheets

(56) References Cited

FOREIGN PATENT DOCUMENTS

| | | |
|---|---|---|
| JP | 2000-228514 | 8/2000 |
| JP | 2003-18467 | 1/2003 |
| JP | 2003-37846 | 2/2003 |
| JP | 2004-523112 | 7/2004 |
| JP | 2006-201044 | 8/2006 |
| JP | 3862850 | 10/2006 |
| JP | 2006-528444 | 12/2006 |
| JP | 2007-124675 | 5/2007 |
| WO | 02/058157 | 7/2002 |
| WO | WO 2005/013605 | 2/2005 |

* cited by examiner (a)

(b)

(c)

CHARGE MULTIPLYING SOLID STATE IMAGING DEVICE HAVING MULTIPLICATION REGISTER UNITS WITH DIFFERENT NUMBER OF MULTIPLICATION STAGES

TECHNICAL FIELD

The present invention relates to a charge multiplying type of solid-state imaging device such as an EM-CCD.

BACKGROUND ART

Charge-Coupled Devices (CCDs) have been widely known as solid-state imaging devices for taking images of incident light, and among the CCDs, an EM-CCD (Electron Multiplying-CCD) that enables taking an image of weak light has been known. This type of solid-state imaging device includes, in addition to an imaging area that includes a plurality of photodiodes or the like and generates charges according to the amount of incident light and an output register unit that reads out the charges of the imaging area, a multiplication register unit that multiplies the read-out charges, and enables taking an image of weak light by using a charge multiplication effect of the multiplication register unit. This type of solid-state imaging device has been disclosed in Patent Literatures 1 to 3.

The solid-state imaging devices described in Patent Literatures 1 and 2 control the multiplication factor (gain) of the multiplication register unit based on an output of the multiplication register unit. Moreover, the solid-state imaging device described in Patent Literature 3 further includes an additional register unit, and increases the dynamic range by using the additional register unit for an excess charge of the multiplication register unit.

CITATION LIST

Patent Literature

Patent Literature 1: Japanese Patent Laid-Open No. 2007-124675
Patent Literature 2: Japanese Patent No. 3862850
Patent Literature 3: Japanese Patent Laid-Open No. 2004-523112

SUMMARY OF INVENTION

Technical Problem

Meanwhile, when this type of solid-state imaging device is applied to a spectrometer or the like to be used for a spectroscopic measurement or the like, light made incident into the imaging area has an intensity distribution, and the intensity distribution of the incident light may greatly exceed the dynamic range of the solid-state imaging device. Therefore, it is considered, in order to match the dynamic range of the solid-state imaging device to the intensity distribution of incident light, to control the multiplication factor of the multiplication register unit as in the solid-state imaging devices described in Patent Literatures 1 and 2.

However, in the solid-state imaging devices described in Patent Literatures 1 and 2, the amplification factor of the amplification register unit is controlled uniformly with respect to the entire imaging area, and thus when the intensity of incident light is greatly different depending on the position in the imaging area, the multiplication factor of the multiplication register unit is beyond control, and it is difficult to appropriately match the dynamic range of the solid-state imaging device to the intensity distribution of incident light.

Moreover, the solid-state imaging device described in Patent Literature 3 compensates for deficiency in the charge capacity of the multiplication register unit by use of the additional register unit when the amount of incident light is large, but even in this solid-state imaging device, the multiplication and additional register units are provided one each for the imaging area, and thus when the intensity of incident light is greatly different depending on the position in the imaging area, the multiplication factor of the multiplication register unit is beyond control, and it is difficult to appropriately match the dynamic range of the solid-state imaging device to the intensity distribution of incident light.

Therefore, it is an object of the present invention to provide a solid-state imaging device capable of, even when the intensity of incident light is greatly different depending on the position in the imaging area, appropriately controlling the multiplication factor of the multiplication register unit.

Solution to Problem

A solid-state imaging device of the present invention is a charge multiplying solid-state imaging device, and includes an imaging area that generates a charge according to the amount of incident light, a plurality of output register units that receive the charge from the imaging area, and a plurality of multiplication register units that multiply charges from the output registers, respectively, and the multiplication register units are different in the number of multiplication stages from each other.

According to this solid-state imaging device, which is a multi-port solid-state imaging device including a plurality of multiplication register units for the imaging area, by differentiating the number of multiplication stages of the multiplication register units port by port, the amplification factor of the multiplication register units can be differentiated port by port. Therefore, even when the intensity of incident light is greatly different depending on the position in the imaging area, the multiplication factor of the multiplication register units can be appropriately controlled, which allows appropriately matching the dynamic range of the solid-state imaging device to the intensity distribution of incident light.

It is preferable that the solid-state imaging device described above further includes a plurality of dummy register units not having a charge multiplication effect and for compensating for a difference in the number of multiplication stages of the multiplication register units. According to this configuration, a difference in delay time of the multiple ports can be reduced.

It is preferable that each of the multiplication registers has a predetermined number of stages of multiplication registers, and a multiplication register other than the number of multiplication stages out of the predetermined number of stages of multiplication registers functions as a dummy register not having a charge multiplication effect. According to this, for example, on an integrated circuit, multiplication registers of a number of stages capable of addressing the minimum amount of incident light may be mounted in all of the multiplication register units, and then the number of multiplication stages in each multiplication register unit may be easily changed by external control of a drive voltage or the like.

It is preferable that the solid-state imaging device described above further includes a control unit that controls the number of multiplication stages of each of the multiplication register units according to the amount of charge output from the multiplication register units. According to this configuration, for example, on an integrated circuit, multiplication registers of a number of stages capable of addressing the minimum amount of incident light may be mounted in all of the multiplication register units, and then the number of multiplication stages in each multiplication register unit may be autonomously changed.

The control unit described above may supply the multiplication register that is made to function as a dummy register with a drive voltage different from that of multiplication registers of the number of multiplication stages.

Advantageous Effects of Invention

According to the present invention, even when, in a charge multiplying solid-state imaging device, the intensity of incident light is greatly different depending on the position in the imaging area, the multiplication factor of the multiplication register unit can be appropriately controlled. As a result, the dynamic range of the solid-state imaging device can be appropriately matched to the intensity distribution of incident light.

DESCRIPTION OF EMBODIMENTS

Figure 1:
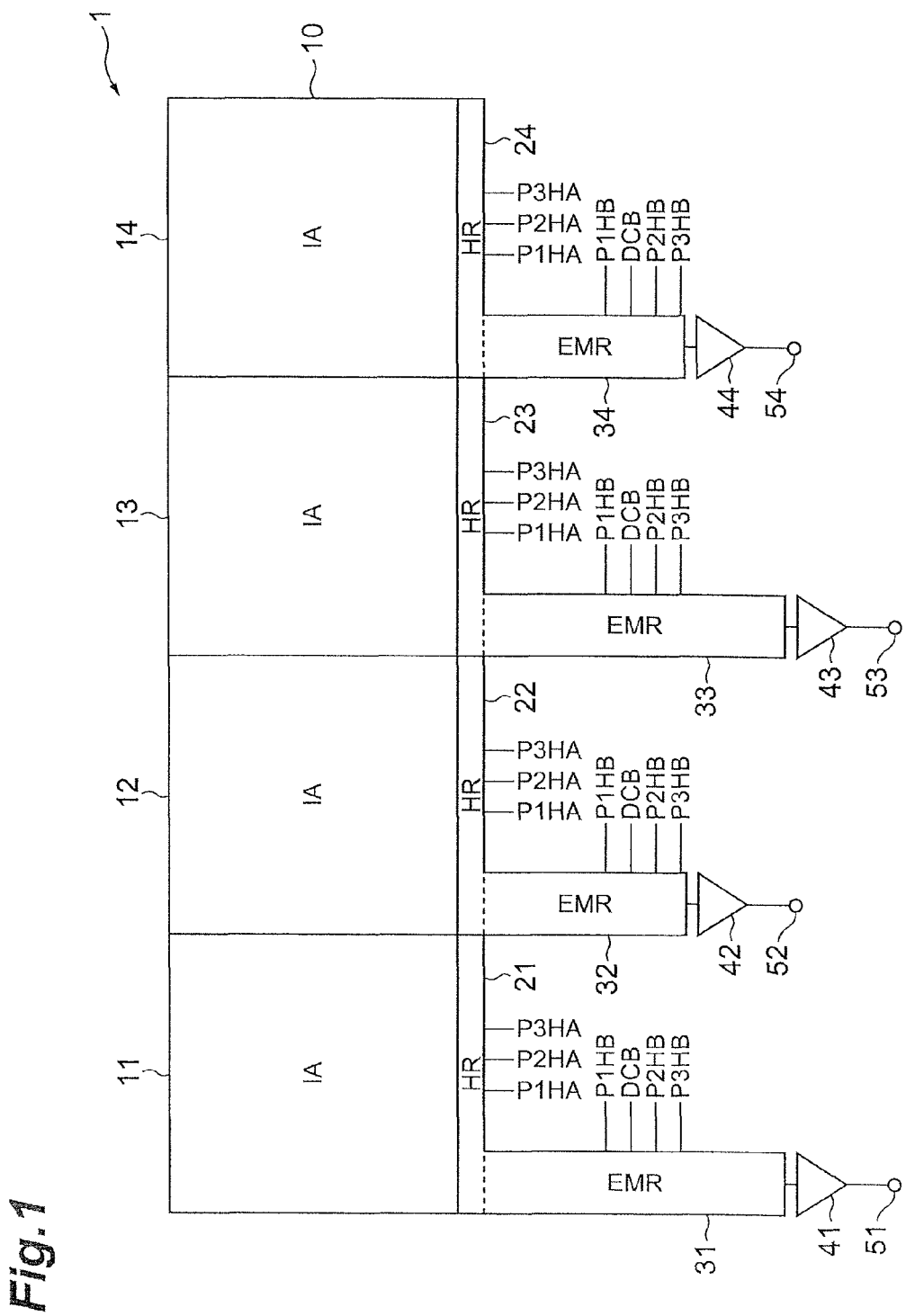
FIG. 1 is a diagram showing a configuration of a solid-state imaging device according to a first embodiment of the present invention.

Hereinafter, preferred embodiments of the present invention will be described in detail with reference to the drawings. Also, the same or corresponding parts will be denoted with the same reference numerals in the drawings.
[First Embodiment]

FIG. 1 is a diagram showing a configuration of a solid-state imaging device according to a first embodiment of the present invention. The solid-state imaging device 1 shown in FIG. 1 is a charge multiplying solid-state imaging device, and is a multi-port solid-state imaging device including an imaging area (IA) 10, four horizontal register units (HRs) 21 to 24, four multiplication register units (EMRs) 31 to 34, four amplifiers 41 to 44, and four output ports 51 to 54.

The imaging area 10 is for taking an image of incident light, and contains a plurality of pixel units. Each pixel unit has a photodiode that generates charge of an amount according to the amount of incident light, and a charge accumulating unit that accumulates the charge. Each pixel unit performs, in response to a clock having a periodic pulsed voltage, in-pixel charge transfer from the photodiode to the charge accumulating unit, charge transfer from the charge accumulating unit to each of the horizontal register units 21 to 24, and the like.

Each of the horizontal register units 21 to 24 includes a plurality of horizontal registers horizontally arrayed corresponding to every vertical line of partial imaging areas 11 to 14 in the imaging area 10, and in response to a clock having a periodic pulsed voltage input to control electrodes P1HA, P2HA, and P3HA, sequentially transfers charges of each horizontal register to each of the multiplication register units 31 to 34.

Figure 2:
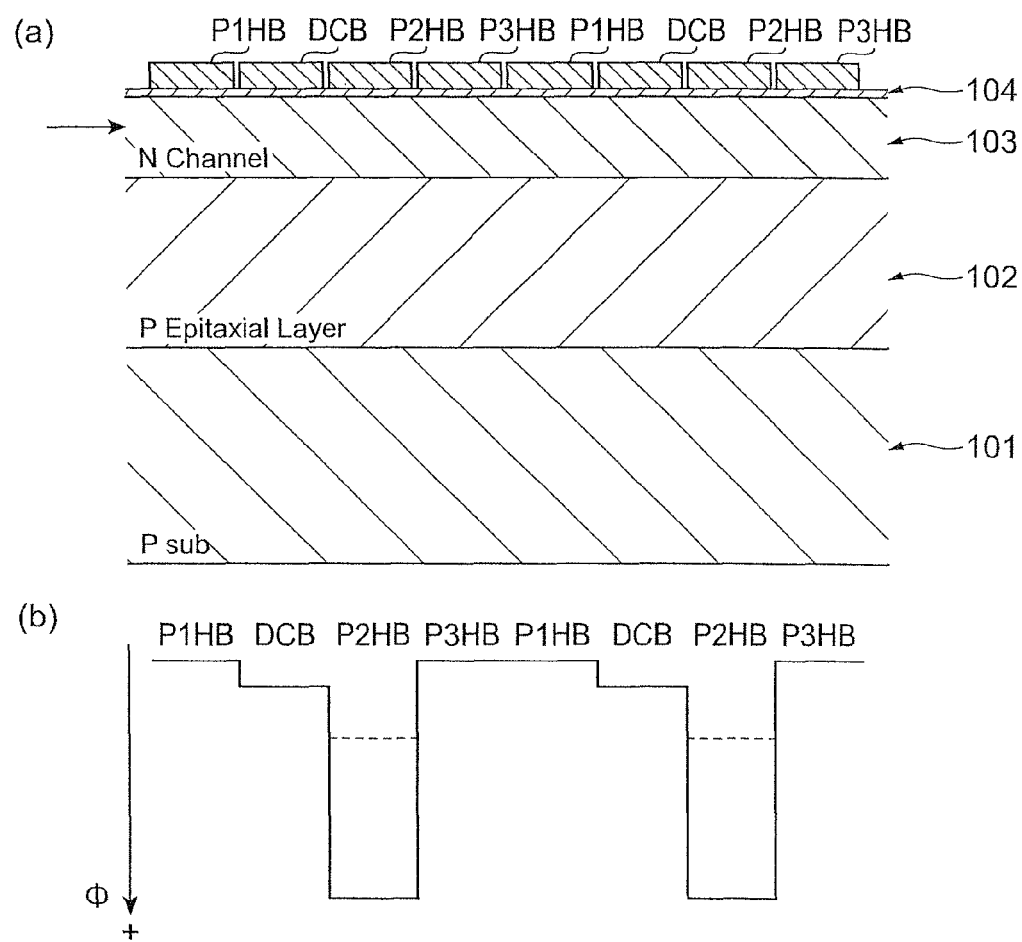
FIG. 2 includes views showing a sectional structure of a multiplication register unit shown in FIG. 1, and energy potential in a multiplying operation.

Each of the multiplication register units 31 to 34 includes a plurality of multiplication registers, multiplies the charges sequentially transferred from each of the horizontal register units 21 to 24, and outputs the charges to each of the amplifiers 41 to 44. FIG. 2 shows a sectional structure of a multiplication register unit and energy potential in a multiplying operation. As shown in FIG. 2(a), each multiplication register is formed by sequentially arraying four control electrodes P1HB, DCB, P2HB, and P3HB on a layered structure for which a p-type epitaxial layer 102, an n-type channel layer 103, and an oxide film 104 are sequentially stacked on a p-type substrate 101, and these multiplication registers are arrayed in a plural number to form each of the multiplication register units 31 to 34. To the control electrodes PH1B, P2HB, and P3HB, clocks having periodic pulsed voltages are sequentially applied. Moreover, to the control electrode DCB, a direct-current voltage is applied. Also, the arrow in FIG. 2(a) indicates a charge transfer direction.

First, when a pulsed voltage (clock) of a value larger than that of a direct-current voltage of the electrode DCB is applied to the electrode P1HB, the energy potential of a channel layer part below the electrode P1HB becomes higher than that of a channel layer part below the electrode DCB (downward in FIG. 2(b)), and a potential well is produced in the channel layer part below the electrode P1HB, to which a charge is transferred from a channel layer part below the electrode P3HB located at the side opposite to the charge transfer direction of the electrode P1HB, and retained.

Next, when the pulsed voltage of the electrode P1HB lowers, and a pulsed voltage (clock) of a high voltage value is applied to the electrode P2HB, the energy potential of the channel layer part below the electrode P1HB becomes lower than that of the channel layer part below the electrode DCB (upward), and the energy potential of a channel layer part below the electrode P2HB becomes greater and higher than that of the channel layer part below the electrode DCB (downward), that is, becomes higher than an energy potential for normal transfer (the dotted line in FIG. 2(b)). Then, a charge is transferred to the channel layer part below the electrode DCB, and thereafter, a charge is transferred to the channel layer part below the electrode P2HB. At this time, charge multiplication is performed by an impact ionization effect.

Next, when the pulsed voltage of the electrode P2HB lowers, and a pulsed voltage (clock) is applied to the electrode P3HB, the energy potential of the channel layer part below the electrode P2HB becomes lower than that of the channel layer part below the electrode P3HB (upward), and a charge is transferred to the channel layer part below the electrode P3HB.

In this way, in each multiplication register, charge multiplication is to be performed in the process of charge transfer. Since the charge multiplication effect by an impact ionization effect per one stage of multiplication register is small, the multiplication register units 31 to 34 have approximately several hundred stages of multiplication registers, for example.

Each of the amplifiers 41 to 44 amplifies as well as converts a charge transferred from each of the multiplication register units 31 to 34 to a voltage signal, and outputs the signal to each of the output ports 51 to 54.

Meanwhile, when a solid-state imaging device is applied to a spectrometer or the like to be used for a spectroscopic measurement or the like, light made incident into the imaging area has an intensity distribution, and the intensity distribution of the incident light may greatly exceed the dynamic range of the solid-state imaging device. However, in most cases of this type of measurement, the intensity distribution of the incident light is substantially constant.

Therefore, it is assumed, in the present embodiment, that it is known in advance that the intensity of light made incident into the partial imaging areas 11 and 13 of the imaging area 10 is weak, and the intensity of light made incident into the partial imaging areas 12 and 14 is strong.

On the basis of this assumption, in the present embodiment, out of the multiplication register units 31 to 34, the number of multiplication stages of the multiplication register units 31 and 33 corresponding to the partial imaging areas 11 and 13 is set large in advance, and the number of multiplication stages of the multiplication register units 32 and 34 corresponding to the partial imaging areas 12 and 14 is set small in advance. Accordingly, the multiplication factor of the multiplication register units 31 and 33 is large, and the multiplication factor of the multiplication register units 32 and 34 is small.

In the following, advantageous effects of the solid-state imaging device 1 of the first embodiment will be described by using FIG. 3 to FIG. 5.

Figure 3:
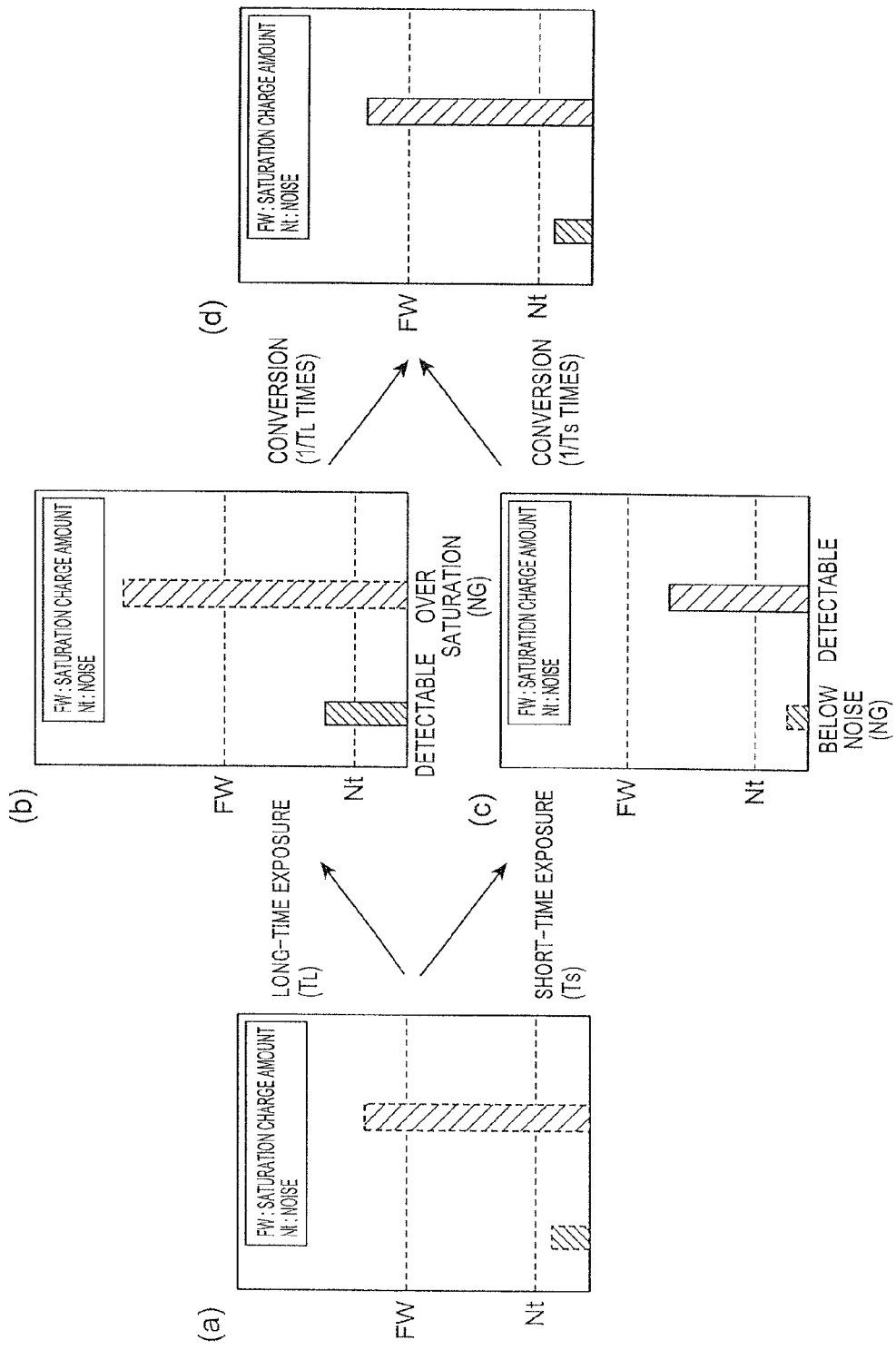
FIG. 3 includes views showing a measuring method of a multi-port solid-state imaging device of conventional example 1.

FIG. 3 includes views showing a measuring method of a multi-port solid-state imaging device of conventional example 1. The multi-port solid-stage imaging device of conventional example 1 is different from the solid-state imaging device 1 of the first embodiment in that the multiplication register units 31 to 34 are the same and constant in the number of multiplication stages and the multiplication factor in the solid-state imaging device 1. This multi-port solid-state imaging device of conventional example 1 is for performing a measurement of incident light having an intensity distribution that exceeds the dynamic range by changing the exposure time.

For example, as shown in FIG. 3(*a*), in the case of a measurement of an incident light with a read-out charge amount smaller than a noise level Nt of the multiplication register unit, as shown in FIG. 3(*b*), the incident light is measured by exposure for a long time $T_L$, and as shown in FIG. 3(*d*), reciprocal-times conversion of the exposure time $T_L$ is performed. On the other hand, as shown in FIG. 3(*a*), in the case of a measurement of an incident light with a read-out charge amount exceeding a saturation charge amount FW of the multiplication register unit, as shown in FIG. 3(*c*), the incident light is measured by exposure for a short time $T_S$, and as shown in FIG. 3(*d*), reciprocal-times conversion of the exposure time $T_S$ is performed. Thus, in the measuring method of the multi-port solid-state imaging device of conventional example 1, it has been necessary to perform a plurality of times of measurement by changing the exposure time, so that the measurement was troublesome.

Figure 4:
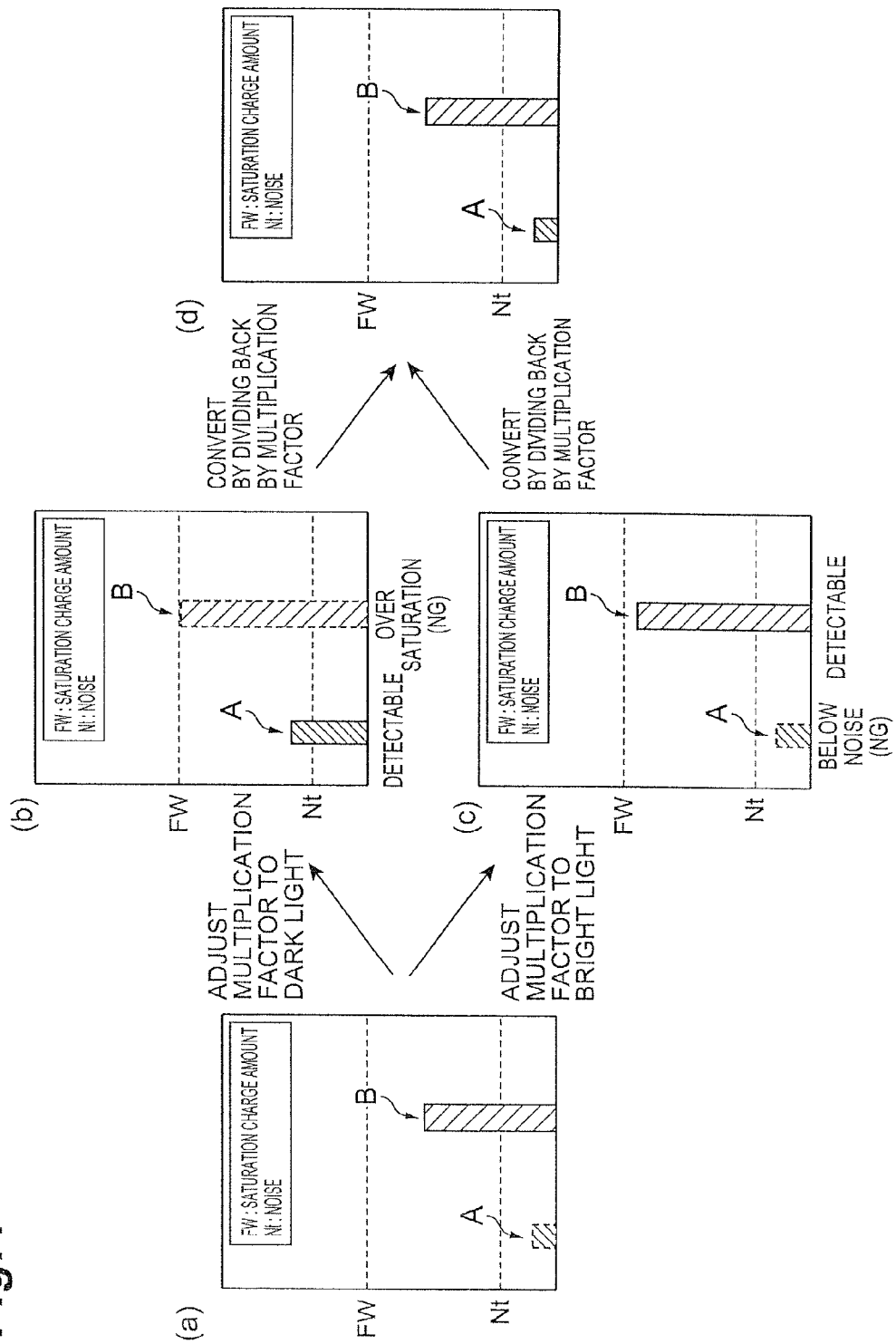
FIG. 4 includes views showing a measuring method of a multi-port solid-state imaging device of conventional example 2.

Next, a measuring method of a multi-port solid-state imaging device of conventional example 2 is shown in FIG. 4. The multi-port solid-stage imaging device of conventional example 2 is different from the solid-state imaging device 1 of the first embodiment in that the multiplication register units 31 to 34 are the same in the number of multiplication stages in the solid-state imaging device 1. This multi-port solid-state imaging device of conventional example 2 is for performing a measurement of incident light having an intensity distribution that exceeds the dynamic range by changing the multiplication factor of the multiplication register units, and corresponds to the solid-state imaging devices described in Patent Literatures 1 and 2.

For example, as shown in FIG. 4(*a*), consideration is given of a case where the intensity of an incident light is less than the lower limit of the dynamic range depending on the position in the imaging area, and the read-out charge amount may be smaller than a noise level Nt of the multiplication register unit. As shown in FIG. 4(*b*), if the multiplication factor of the multiplication register unit is increased in order to make this incident light A less than the lower limit measurable, since the multiplication factor of the multiplication register unit is increased with respect to the entire imaging area, an incident light B that has been measurable prior to the multiplication factor control exceeds the upper limit of the dynamic range, and a read-out charge amount of this incident light B exceeds a saturation charge amount FW of the multiplication register unit. On the other hand, as shown in FIG. 4(*c*), if the multiplication factor of the multiplication register unit is adjusted to the incident light B, the incident light A cannot be made measurable. Even so, if necessary, by performing two times of measurement of a measurement of FIG. 4(*b*) and a measurement of FIG. 4(*c*), and then converting by dividing back by the multiplication factor in the respective measurements, both lights can indeed be made measurable as shown in FIG. 4(*d*), but it is necessary to perform a plurality of times of measurement by changing the multiplication factor, so that the measurement was troublesome.

However, according to the multi-port solid-state imaging device 1 of the first embodiment, both of the incident light A and incident light B described above can be made measurable. FIG. 5 includes views showing a measuring method of the multi-port solid-state imaging device 1 of the first embodiment. The multi-port solid-state imaging device 1 of the first embodiment is for performing a measurement of incident light having an intensity distribution that exceeds the dynamic range by, as described above, differentiating the number of multiplication stages of the multiplication register units 31 to 34 port by port.

Figure 5:
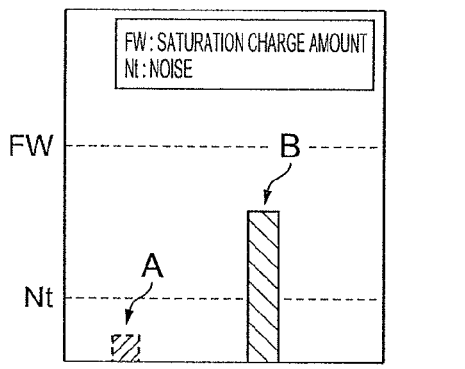
FIG. 5 includes views showing a measuring method of the multi-port solid-state imaging device 1 of the first embodiment.
Figure 5:
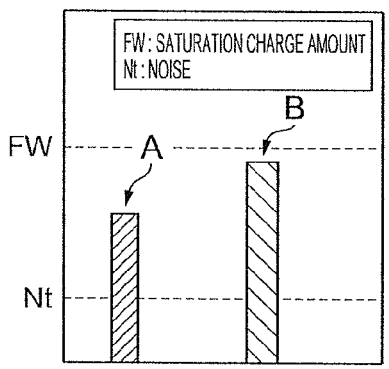
Figure 5:
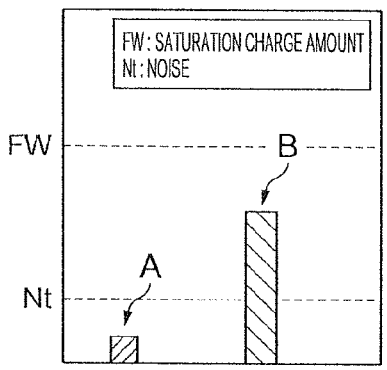

In the solid-state imaging device 1 of the first embodiment, as shown in FIG. 5(*a*), when it is known in advance that the intensity of an incident light A of the partial imaging areas 11 and 13 is less than the lower limit of the dynamic range and the read-out charge amount is smaller than a noise level Nt of the multiplication register unit, the number of multiplication stages of the multiplication register units 31 and 33 is set large, and the multiplication factor is high. As a result, as shown in FIG. 5(*b*), this incident light A can be made measurable. On the other hand, as shown in FIG. 5(*a*), when it is known in advance that the intensity of an incident light B of the partial imaging areas 12 and 14 is within the dynamic range and the read-out charge amount is not less than a noise level Nt of the multiplication register unit and not more than a saturation charge amount FW, the number of multiplication stages of the multiplication register units 32 and 34 is set small, and the multiplication factor is low. As a result, as shown in FIG. 5(*b*), this incident light B can also be made measurable. Actual measurement values are obtained as in FIG. 5(*c*) as results of the respective measurement values divided back by the multiplication factor of the incident lights A and B measured in FIG. 5(*b*).

Thus, according to the solid-state imaging device 1 of the first embodiment, which is a multi-port solid-state imaging device including a plurality of multiplication register units 31 to 34 for the imaging area 10, by differentiating the number of multiplication stages of the multiplication register units 31 to 34 port by port, the amplification factor of the multiplication register units 31 to 34 can be differentiated port by port. Therefore, even when the intensity of incident light is greatly different depending on the position in the imaging area 10, the multiplication factor of the multiplication register units 31 to 34 can be appropriately controlled, which allows appropriately matching the dynamic range of the solid-state imaging device 1 to the intensity distribution of incident light.

Moreover, according to the solid-state imaging device 1 of the first embodiment, since the multiplication factor varies depending on the number of multiplication stages, clock voltages of the multiplication register units 31 to 34 can be made common.

[Second Embodiment]

Figure 6:
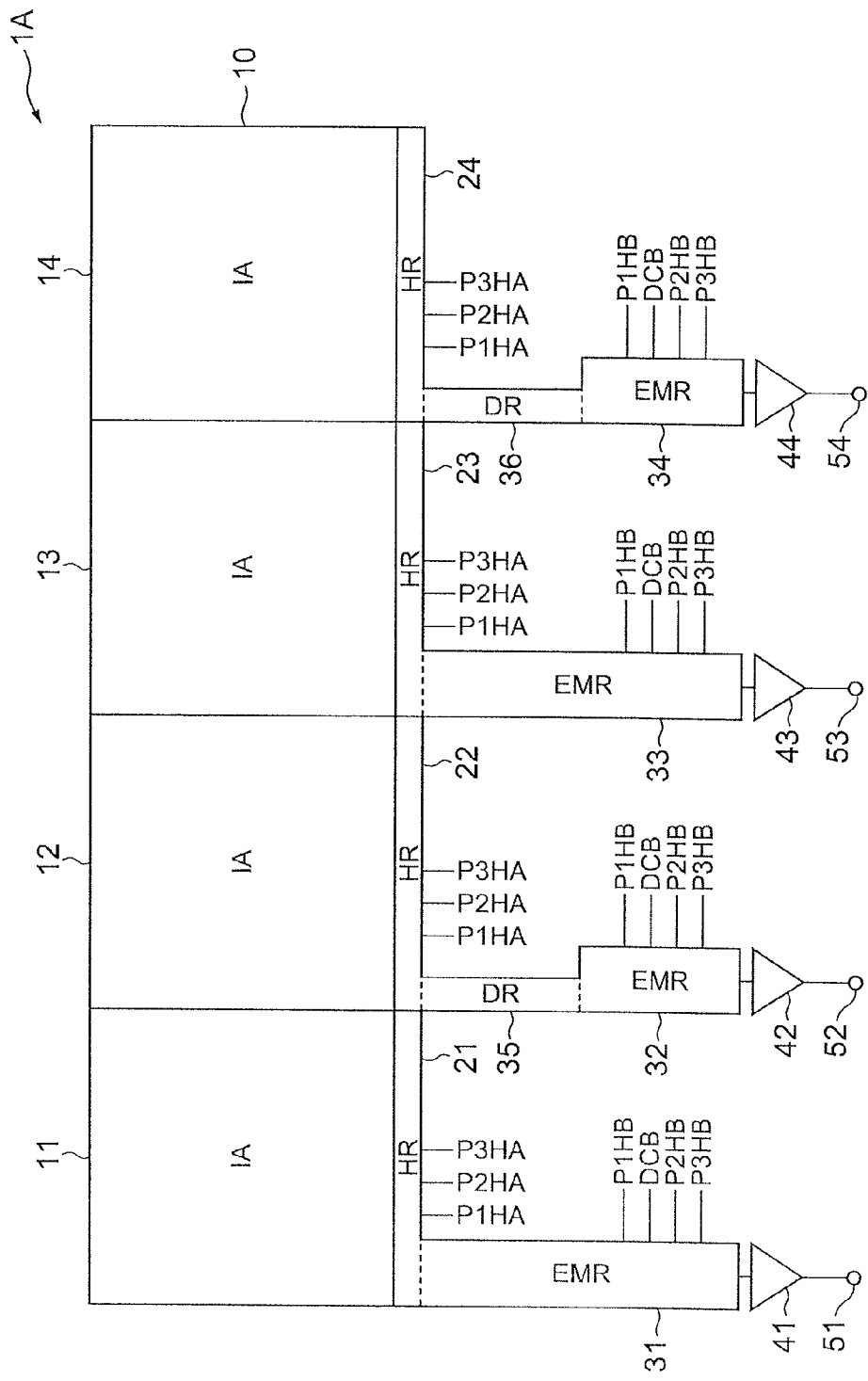
FIG. 6 is a diagram showing a configuration of a solid-state imaging device according to a second embodiment of the present invention.

FIG. 6 is a diagram showing a configuration of a solid-state imaging device according to a second embodiment of the present invention. The solid-stage imaging device 1A shown in FIG. 6 is different from the first embodiment in an aspect of the configuration further including dummy register units 35 and 36 in the solid-state imaging device 1. Other aspects of the configuration of the solid-state imaging device 1A are the same as those of the solid-state imaging device 1.

The dummy register unit 35 is disposed between the multiplication register unit 32 with a small number of multiplication stages and the horizontal register unit 22. The dummy register unit 35 includes a plurality of registers, and each register has the same configuration as that of the horizontal register in the horizontal register units 21 to 24, for example. That is, the dummy register unit 35 does not have a charge multiplication effect as in the horizontal register units 21 to 24. The number of register stages of the dummy register unit 35 is set to a difference between the number of stages of the multiplication register unit 31 (33) and the number of stages of the multiplication register unit 32. Accordingly, the total number of stages of the multiplication register unit 32 and the dummy register unit 35 becomes equal to the number of stages of the multiplication register unit 31 (33), and the total overall length of the multiplication register unit 32 and the dummy register unit 35 becomes substantially equal to the overall length of the multiplication register unit 31 (33).

Similarly, the dummy register unit 36 is disposed between the multiplication register unit 34 with a small number of multiplication stages and the horizontal register unit 24. The dummy register unit 36 includes a plurality of registers, and each register has the same configuration as that of the horizontal register in the horizontal register units 21 to 24, for example. That is, the dummy register unit 36 does not have a charge multiplication effect as in the horizontal register units 21 to 24. The number of register stages of the dummy register unit 36 is set to a difference between the number of stages of the multiplication register unit 31 (33) and the number of stages of the multiplication register unit 34. Accordingly, the total number of stages of the multiplication register unit 34 and the dummy register unit 36 becomes equal to the number of stages of the multiplication register unit 31 (33), and the total overall length of the multiplication register unit 34 and the dummy register unit 36 becomes substantially equal to the overall length of the multiplication register unit 31 (33).

Also in this solid-state imaging device 1A of the second embodiment, similar advantages to those of the solid-state imaging device 1 of the first embodiment can be obtained.

Further, according to the solid-state imaging device 1A of the second embodiment, the total number of stages of registers in each port is equal and the total overall length is substantially equal, and thus a difference in delay time of the multiple ports can be reduced.

[Third Embodiment]

Figure 7:
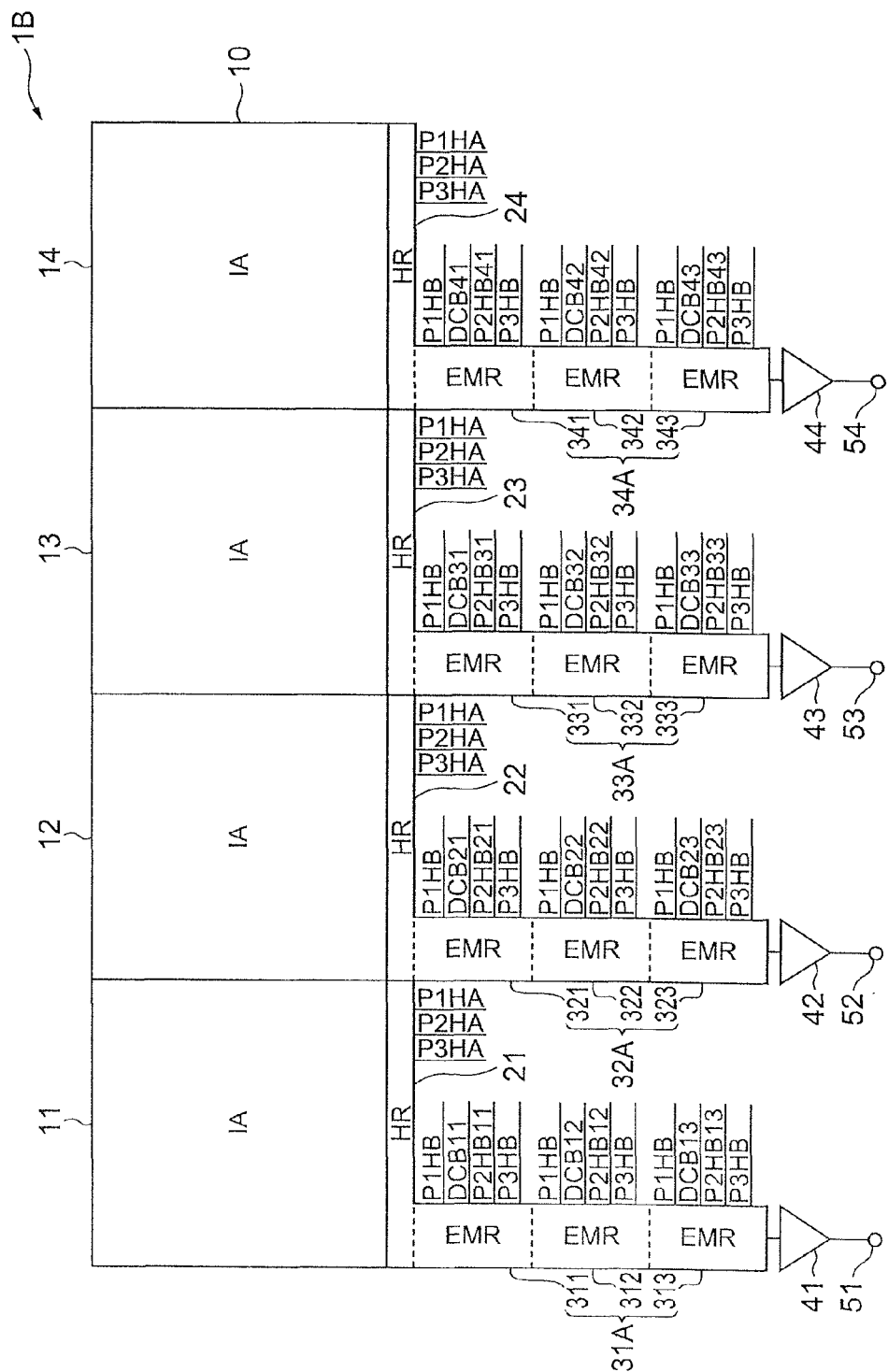
FIG. 7 is a diagram showing a configuration of a solid-state imaging device according to a third embodiment of the present invention.

FIG. 7 is a diagram showing a configuration of a solid-state imaging device according to a third embodiment of the present invention. The solid-stage imaging device 1B shown in FIG. 7 is different from the first embodiment in an aspect of the configuration including multiplication register units 31A to 34A in place of the multiplication register units 31 to 34 in the solid-state imaging device 1. Other aspects of the configuration of the solid-state imaging device 1B are the same as those of the solid-state imaging device 1.

The multiplication register units 31A to 34A, in which control voltages to be applied to the electrodes are different, but have the same configuration, and thus in the following, the configuration of the multiplication register unit 31A will be described in detail as a representative of the multiplication register units 31A to 34A.

The multiplication register unit 31A (32A, 33A, 34A) includes three multiplication register units 311 to 313 (321 to 323, 331 to 333, 341 to 343) to which the same control voltage is supplied, and each of the multiplication register units 311 to 313 (321 to 323, 331 to 333, 341 to 343) includes the above-described multiplication registers in a plural number. In the multiplication register unit 311 (321, 331, 341), by controlling the value of pulsed voltage to be applied to an electrode P2HB11 (P2HB21, P2HB31, P2HB41) and the value of direct-current voltage to be applied to an electrode DCB11 (DCB21, DCB31, DCB41) of the four control electrodes in the multiplication register, whether a charge multiplication effect exists can be controlled. In the multiplication register unit 312 (322, 332, 342) as well, by controlling the value of pulsed voltage to be applied to an electrode P2HB12 (P2HB22, P2HB32, P2HB42) and the value of direct-current voltage to be applied to an electrode DCB12 (DCB22, DCB32, DCB42) of the four control electrodes in the multiplication register, whether a charge multiplication effect exists can be controlled. In the multiplication register unit 313 (323, 333, 343) as well, by controlling the value of pulsed voltage to be applied to an electrode P2HB13 (P2HB23, P2HB33, P2HB43) and the value of direct-current voltage to be applied to an electrode DCB13 (DCB23, DCB33, DCB43) of the four control electrodes in the multiplication register, whether a charge multiplication effect exists can be controlled.

In this multiplication register unit 31A, by controlling the control voltage of the multiplication register units 311 to 313 through external control to provide a charge multiplication effect to all of the multiplication register units 311 to 313, the same number of multiplication stages as that of the above-described multiplication register unit 31 can be obtained. In the multiplication register unit 33A as well, by controlling the control voltage of the multiplication register units 331 to 333 through external control to provide a charge multiplication effect to all of the multiplication register units 331 to 333, the same number of multiplication stages as that of the above-described multiplication register unit 33 can be obtained.

On the other hand, in the multiplication register unit 32A, by controlling the control voltage of the multiplication register unit 323 through external control to provide a charge multiplication effect to the multiplication register unit 323, the same number of multiplication stages as that of the above-described multiplication register unit 32 can be obtained. Moreover, by controlling the control voltage of the multiplication register units 321 and 322 through external control to not provide a charge multiplication effect to either of the multiplication register units 321 and 322, the same number of stages as that of the above-described dummy register unit 35 can be obtained. Similarly, in the multiplication register unit 34A, by controlling the control voltage of the multiplication register unit 343 through external control to provide a charge multiplication effect to the multiplication register unit 343, the same number of multiplication stages as that of the above-described multiplication register unit 34 can be obtained. Moreover, by controlling the control voltage of the multiplication register units 341 and 342 through external control to not provide a charge multiplication effect to either of the multiplication register units 341 and 342, the same number of stages as that of the above-described dummy register unit 36 can be obtained.

Also in this solid-state imaging device 1B of the third embodiment, similar advantages to those of the solid-state imaging device 1 of the first embodiment can be obtained.

Further, according to the solid-state imaging device 1B of the third embodiment, for example, on an integrated circuit, multiplication registers of a number of stages capable of addressing the minimum amount of incident light may be mounted in all of the multiplication register units 31A, 32A, 33A, and 34A, and then the number of multiplication stages in each multiplication register unit 31A, 32A, 33A, 34A may be easily changed by external control of a drive voltage or the like.

[Fourth Embodiment]

Figure 8:
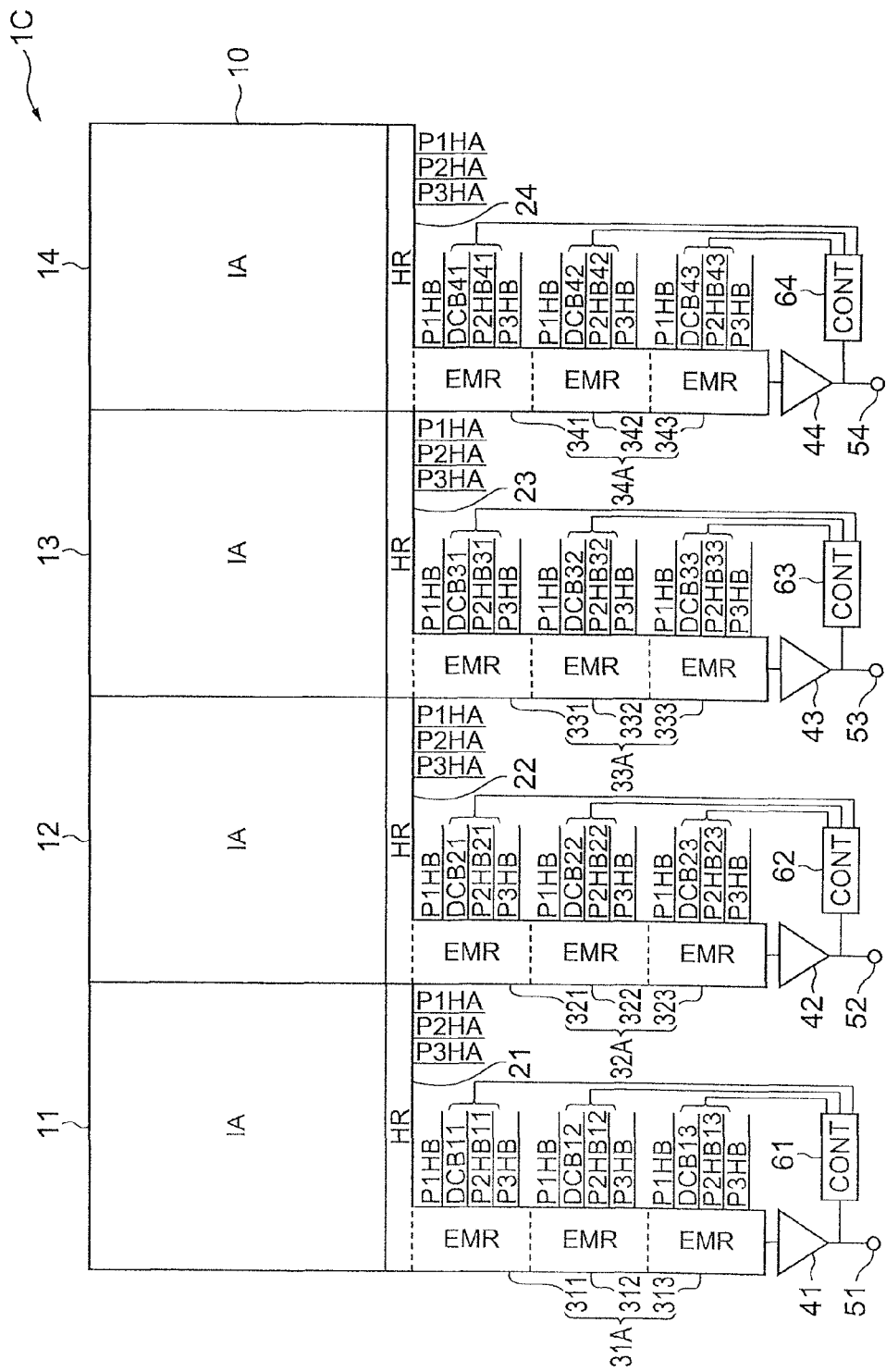
FIG. 8 is a diagram showing a configuration of a solid-state imaging device according to a fourth embodiment of the present invention.

FIG. 8 is a diagram showing a configuration of a solid-state imaging device according to a fourth embodiment of the present invention. The solid-stage imaging device 1C shown in FIG. 8 is different from the third embodiment in an aspect of the configuration further including a plurality of control units 61 to 64 in the solid-state imaging device 1B. Other aspects of the configuration of the solid-state imaging device 1C are the same as those of the solid-state imaging device 1B.

The control units 61 to 64 have the same configuration, and thus in the following, the configuration of the control unit 61 will be described in detail as a representative of the control units 61 to 64.

The control unit 61 (62, 63, 64), based on an output voltage of the amplifier 41 (42, 43, 44), controls voltages of the control electrodes P2HB11 to P2HB13 and DCB11 to DCB13 (P2HB21 to P2HB23 and DCB21 to DCB23, P2HB31 to P2HB33 and DCB31 to DCB33, P2HB41 to P2HB43 and DCB41 to DCB43) of the multiplication register units 311 to 313 (321 to 323, 331 to 333, 341 to 343) in the multiplication register unit 31A (32A, 33A, 34A).

Figure 9:
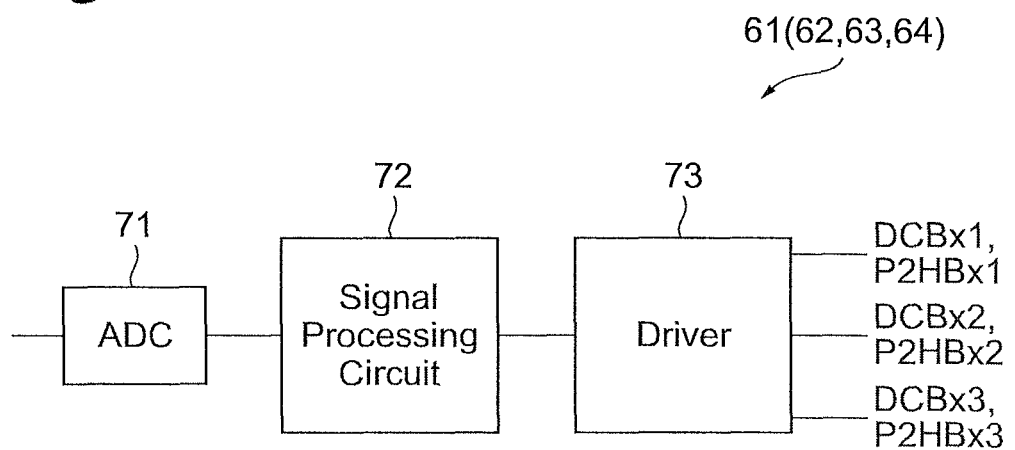
FIG. 9 is a diagram showing a configuration of each control unit shown in FIG. 8.

FIG. 9 is a diagram showing a configuration of each control unit. As shown in FIG. 9, the control unit 61 (62, 63, 34) has an analog/digital converter (hereinafter, referred to as an ADC) 71, a signal processing circuit 72, and a driver 73.

The ADC 71 sequentially converts output voltage values sequentially supplied from the amplifier 41 (42, 43, 44) to digital values.

The signal processing circuit 72, based on the digital values sequentially supplied from the ADC 71, determines the voltage values of clocks and direct-current voltages to be supplied to the multiplication register units 311 to 313 (321 to 323, 331 to 333, 341 to 343) in the multiplication register unit 31A (32A, 33A, 34A). For example, the signal processing circuit 72 determines any of the maximum value, minimum value, and average value of digital values corresponding to the amount of charge for one horizontal line. Then, the signal processing circuit 72 determines the pulsed voltage values of clocks to be applied to the control electrodes P2HB11 to P2HB13 (P2HB21 to P2HB23, P2HB31 to P2HB33, P2HB41 to P2HB43) of the multiplication register units 311 to 313 (321 to 323, 331 to 333, 341 to 343) and the direct-current voltage values to be applied to the control electrodes DCB11 to DCB13 (DCB21 to DCB23, DCB31 to DCB33, and DCB41 to DCB43) of the multiplication register units 311 to 313 (321 to 323, 331 to 333, 341 to 343), if the digital value is large, so as to reduce the number of multiplication stages of the multiplication register units 311 to 313 (321 to 323, 331 to 333, 341 to 343), and if the digital value is small, so as to increase the number of multiplication stages of the multiplication register units 311 to 313 (321 to 323, 331 to 333, 341 to 343).

The driver 73 generates clocks for the control electrodes P2HB11 to P2HB13 (P2HB21 to P2HB23, P2HB31 to P2HB33, P2HB41 to P2HB43) having pulsed voltages according to the values determined by the signal processing circuit 72 and direct-current voltages for the control electrodes DCB11 to DCB 13 (DCB21 to DCB23, DCB31 to DCB33, and DCB41 to DCB43) having voltages according to the values determined by the signal processing circuit 72, and supplies the clocks and voltages to the multiplication register units 311 to 313 (321 to 323, 331 to 333, 341 to 343).

In this way, the control unit 61 (63) can, by providing a charge multiplication effect to all of the multiplication register units 311 to 313 (331 to 333), provide the same number of multiplication stages as that of the above-described register unit 31 (33) for the multiplication register unit 31A (33A). On the other hand, the control unit 62 (64) can, by providing a charge multiplication effect to the multiplication register unit 323 (343), obtain the same number of multiplication stages as that of the above-described register unit 32 (34) for the multiplication register unit 32A (34A), and can, by not providing a charge multiplication effect to the multiplication register units 321 and 322 (341 and 342), obtain the same number of stages as that of the above-described dummy register unit 35 (36).

Also in this solid-state imaging device 1C of the fourth embodiment, similar advantages to those of the solid-state imaging device 1 of the first embodiment can be obtained.

Further, according to the solid-state imaging device 1C of the fourth embodiment, for example, on an integrated circuit, multiplication registers of a number of stages capable of addressing the minimum amount of incident light may be mounted in all of the multiplication register units 31A, 32A, 33A, and 34A, and then the number of multiplication stages in each multiplication register unit 31A, 32A, 33A, 34A may be autonomously changed.

It should be noted that the present invention is not limited to the present embodiments described above, and can be variously modified.

In the present embodiments, a multi-port solid-state imaging device including four output ports was exemplified, but the idea of the present invention can be applied to multi-port solid-state imaging devices including two or more output ports.

Moreover, the idea of the present invention can be applied to a variety of forms such as, for example, a line type, an interline type, a frame transfer type, and a full-frame transfer type of solid-state imaging devices.

INDUSTRIAL APPLICABILITY

The present invention can be applied to a use, even when the intensity of incident light is greatly different depending on the position in the imaging area, for appropriately controlling the multiplication factor of the multiplication register unit.

REFERENCE SIGNS LIST 1, 1A, 1B, 1C Solid-state imaging device
10 Imaging area
11 to 14 Partial imaging area
21 to 24 Horizontal register unit (output register unit)
31 to 34, 31A to 34A Multiplication register unit
35, 36 Dummy register unit
44 to 44 Amplifier
51 to 54 Output port
61 to 64 Control unit
71 Analog/digital converter (ADC)
72 Signal processing circuit
73 Driver

The invention claimed is:

1. A charge multiplying solid-state imaging device comprising:
    an imaging area that generates a charge according to the amount of incident light;
    a plurality of output register units that receive the charge from the imaging area; and
    a plurality of multiplication register units that multiply charges from the output registers, respectively, the multiplication register units being different in the number of multiplication stages from each other.

2. The solid-state imaging device according to claim 1, further comprising a plurality of dummy register units not having a charge multiplication effect and for compensating for a difference in the number of multiplication stages of the multiplication register units.

3. The solid-state imaging device according to claim 1, wherein
    each of the multiplication registers has a predetermined number of stages of multiplication registers, and
    a multiplication register other than the number of multiplication stages of the predetermined number of stages of multiplication registers functions as a dummy register not having a charge multiplication effect.

4. The solid-state imaging device according to claim 3, further comprising a control unit that controls the number of multiplication stages of each of the multiplication register units according to the amount of charge output from the multiplication register units.

5. The solid-state imaging device according to claim 4, wherein
    the control unit supplies the multiplication register that is made to function as a dummy register with a drive voltage different from that of multiplication registers of the number of multiplication stages.

* * * * *